United States Patent
Matsuura et al.

(10) Patent No.: US 6,194,273 B1
(45) Date of Patent: Feb. 27, 2001

(54) METHOD OF MANUFACTURING AN INSULATED GATE TYPE SEMICONDUCTOR DEVICE HAVING A U-SHAPED GROOVE

(75) Inventors: Naoki Matsuura; Hiroyasu Enjo, both of Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/410,088

(22) Filed: Oct. 1, 1999

Related U.S. Application Data

(62) Division of application No. 09/275,888, filed on Mar. 25, 1999, now abandoned.

(30) Foreign Application Priority Data

Mar. 25, 1998 (JP) .................................................. 10-076986

(51) Int. Cl.$^7$ ................................................ H01L 21/336
(52) U.S. Cl. ........................... 438/270; 438/273; 257/330
(58) Field of Search .................................... 257/328, 330, 257/333, 334, 627, 628; 438/197, 198, 212, 268, 270, 273, 931, 259

(56) References Cited

U.S. PATENT DOCUMENTS

| | | | | |
|---|---|---|---|---|
| 5,399,515 | * | 3/1995 | Davis et al. ........................ | 438/270 |
| 5,541,425 | * | 7/1996 | Nishihara ............................. | 257/139 |
| 5,723,376 | * | 3/1998 | Takeuchi et al. .................... | 438/270 |
| 5,915,180 | * | 6/1999 | Hara et al. .......................... | 438/270 |
| 5,976,936 | * | 11/1999 | Miyajima et al. .................... | 438/268 |
| 6,022,767 | * | 2/2000 | Yamagishi ............................ | 438/197 |

OTHER PUBLICATIONS

N. Tokura, et al., "The DMOS Consisting of Channel Region Defined by LOCOS (LOCOS–DMOS): A New Process/Device Technology for Low On–Resistance Power MOSFET," 1993 IEEE, pp. 135–140.

* cited by examiner

Primary Examiner—Olik Chaudhuri
Assistant Examiner—Hoai Pham
(74) Attorney, Agent, or Firm—Sughrue, Mion, Zinn, Macpeak & Seas, PLLC

(57) ABSTRACT

An initial layer of an epitaxial layer is formed on an $n^+$ type semiconductor substrate in which a crystal plane of a substrate surface is (100) plane and a crystal plane of its orientation flat is {100} plane. Then, a silicon oxide film having a film thickness of 400 to 600 Å is formed on a surface of the initial layer by thermal oxidization, and a silicon nitride film which functions as a mask for preventing the growth of oxide film and has a film thickness of 600 to 1000 Å is allowed to grow on the silicon oxide film by CVD process and then, is selectively dry etched to form an $n^-$ type epitaxial layer in which an initial groove is formed. Next, an inner surface of the groove is thermally oxidized at the oxidization temperature of 1100 to 1200° C. using the nitride film as a mask, and if an LOCOS oxide film having a film thickness of 0.6 to 0.8 μm is formed, the initial groove becomes a U-shaped groove. A crystal plane of a side wall surface of the groove is inclined with an angle of 0 to 30 degrees with respect to {100} plane.

5 Claims, 2 Drawing Sheets

FIG. 1 (PRIOR ART)
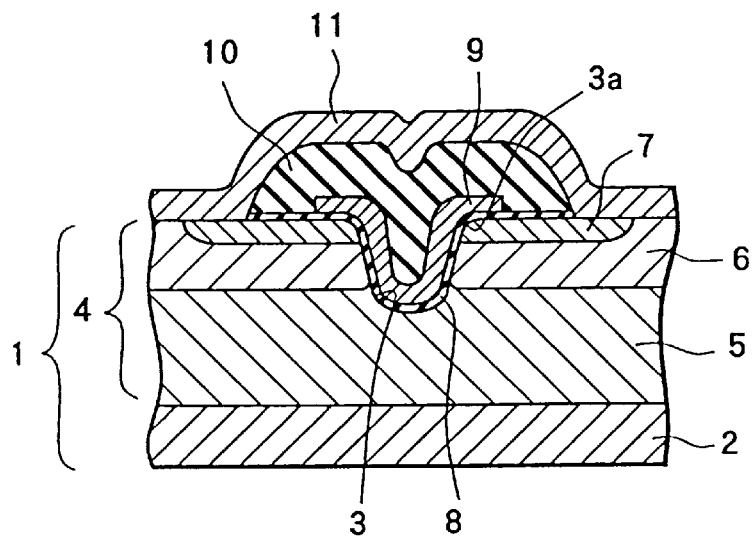
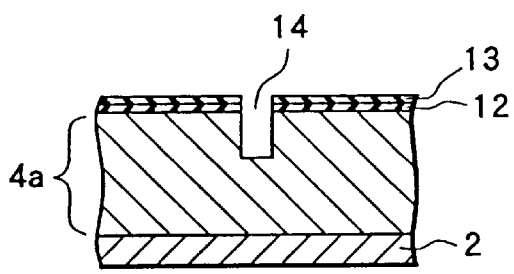
FIG. 2A
(PRIOR ART)
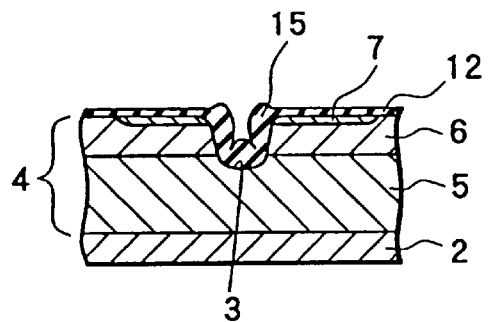
FIG. 2B
(PRIOR ART)
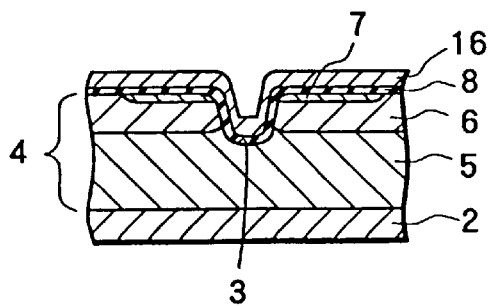
FIG. 2C
(PRIOR ART)

METHOD OF MANUFACTURING AN INSULATED GATE TYPE SEMICONDUCTOR DEVICE HAVING A U-SHAPED GROOVE

This is a divisional of application Ser. No. 09/275,888 filed Mar. 25, 1999, now abandoned, the disclosure of which is incorporated herein by reference.

BACKGROUND OF THE INVENTION

1. Field of the Invention

The present invention relates to an insulated-gate type semiconductor device and a manufacturing method thereof.

2. Description of the Related Art

FIG. 1 shows a conventional MOSFET having a U-shaped groove. In FIG. 1, the reference number 1 represents a semiconductor body including an n$^+$ type semiconductor substrate 2, and an epitaxial layer 4 provided on the semiconductor substrate 2 and formed, on its surface, with a plurality of U-shaped grooves 3 (only one of them is illustrated). The epitaxial layer 4 includes an n$^-$ type drain region 5 which is an initial layer of the epitaxial layer 4, a p type base region 6 provided on the drain region 5, and an n$^+$ type source region 7 provided on a surface of the base region 6. The groove 3 is formed such that it penetrates the base region 6 from the surface of the source region 7 and reaches the drain region 5, and a crystal plane of the side wall surface of the groove 3 is substantially {100} plane. A gate oxide film 8 is provided on an inner surface of the groove 3 and a groove shoulder 3a, and a polysilicon gate electrode 9 is provided on the gate oxide film 8. An interlayer insulation film 10 is provided on the epitaxial layer 4 such as to cover the gate electrode 9, and a source electrode 11 is provided on the interlayer insulation film 10 for electrically connecting with the source region 7 and a surface of the base region 6 by Ohmic contact. Although it is not illustrated, a gate wire is provided on the source electrode 11 through an interlayer insulation film for electrically connecting with the gate electrode 9.

Next, a manufacturing method of this MOSFET will be explained. FIGS. 2A to 2C are sectional views showing the manufacturing method in the order of steps.

First, as shown in FIG. 2A, the initial layer of the epitaxial layer is formed on the n$^+$ type semiconductor substrate 2 in which a crystal plane of the substrate surface is (100) plane and a crystal plane of an orientation flat is ($0\overline{1}\overline{1}$). Then, a silicon oxide film 12 is formed on a surface of the initial layer by thermal oxidation, a silicon nitride film 13 which functions as a mask for preventing the oxide film from growing is allowed to grow on the silicon oxide film 13 by CVD process. Thereafter, the nitride film 13, the oxide film 12 and the initial layer are selectively subjected to etching by PR and dry etching, thereby forming an n$^-$ type epitaxial layer 4a in which a plurality of initial grooves 14 (only one of them is illustrated). The initial groove 14 is subjected to etching such that the crystal plane of the side wall surface becomes substantially {110}. During PR, the adjustment of alignment of patterns are carried out horizontally and vertically with respect to the orientation flat.

Next, as shown in FIG. 2B, the initial groove 14 is thermal oxidized using the nitride film 13 as a mask, and with this oxidization, an LOCOS oxide film 15 is formed and the initial groove 14 becomes the U-shaped groove 3. Then, the nitride film 13 is removed from the entire surface by wet etching process, and boron is injected by ion implantation and thermally diffused using the LOCOS oxide film 15 as a mask, thereby forming the P type base region 6. Further, the base region 6 is masked by the LOCOS oxide film 15 and a photoresist film by PR, arsenic is injected by ion implantation, the photoresist is removed and then is thermally diffused, thereby forming the n$^+$ type source region 7. As a result, the epitaxial layer 4a shown in region 7. As a result, the epitaxial layer 4a shown in drain region 5 which is the initial layer of the epitaxial layer on which the grooves 3 are formed, the base region 6, and the source region 7.

Next, as shown in FIG. 2C, the LOCOS oxide film 15 and the oxide film 12 are removed by the wet etching process so that the base region 6, the source region 7 and the inner surface of the groove 3 are exposed. Then, the gate oxide film 8 is formed on the inner surface of the groove 3, the base region 6 and the source region 7 by the thermal oxidization process, and the surface of the epitaxial layer 4 subjected to the above-described steps is covered with the polysilicon film 16 by the CVD process.

FIG. 1 is a sectional view showing the device after the above-described third step. Subsequently, in a fourth step, the gate electrode 9 is formed by patterning the polysilicon film 16 with PR(Photolithography) and dry etching processes remaining a portion of the film 16 on the grooves 3 and a part of the source region 7. Then, the surface of the epitaxial layer 4 is covered with the interlayer insulation film 10 by the CVD process. Then, a contact hole is formed in the interlayer insulation film 10 and the gate oxide film 8 such that the portion of the surface of the source region 7 and the surface of the base region 6 are exposed. After that, the surface of the epitaxial layer 4 subjected to the above-described steps is covered with an aluminum film by sputtering process, and the aluminum film is selectively removed by PR and the dry etching process, thereby forming a source electrode 11 which is electrically connected to the base region 6 and the source region 7 by Ohmic contact.

Meanwhile, in the above-described manufacturing method, as a first typical condition for determining the U-shaped groove, if a manufacturing condition in which film thickness of the silicon oxide film 12=100 Å, film thickness of the silicon nitride film 11=1500 Å and depth of the groove 14=1.5 μm in the first step is selected, and formation second step is selected, although the groove shoulder 3a shown in FIG. 1 is formed with an angle but radius of curvature R becomes small as 0.1 μm or less, dislocation is when the LOCOS oxide film 15 is formed, and leakage current is prone to be generated under reverse tolerance voltage between the drain region 5 and the base region 6. Further, the gate oxide film 8 is prone to be destroyed due to concentration of electric field of the gate apply voltage at the groove shoulder 3a, and gate short circuit is prone to be generated.

Further, as a second typical condition, if a manufacturing condition in which film thickness of the silicon oxide film 12=100 Å, film thickness of the silicon nitride film 13=500 Å and depth of the groove 14=1.5 μm in the first step is selected, and formation temperature of the LOCOS oxide film 15=1100° C. in the second step is selected, the radius of curvature R of the groove shoulder 3a shown in FIG. 1 becomes large as about 1 μm and current leakage under tolerance voltage or gate short circuit due to small radius of curvature R are not prone to be generated, but since the thickness of the silicon nitride film 13 is thin, abnormality in shape of the groove 3 is generated due to such inconvenience during the process that the silicon nitride film 13 is damaged or oxygen passes through the silicon nitride film 13 and for these reasons, leakage defect and short circuit defect are prone to be generated. If the radius of curvature R of the shoulder 3a is too large, the length of a channel formed in a direction of a surface of the semiconductor body becomes long, which is disadvantageous to on-resistance.

SUMMARY OF THE INVENTION

It is an object of the present invention to provide a field-effect transistor in which on-resistance is lowered by optimizing a condition for determining a shape of a U-shaped groove and a crystal plane of a side wall surface of the groove, and leakage defect and short circuit defect in the manufacturing process and product are suppressed, to a low level, from being generated and a manufacturing method thereof.

An insulated-gate type semiconductor device according to the present invention comprises: a semiconductor body formed on a surface thereof with a U-shaped groove; a gate oxide film provided on an inner surface of the U-shaped groove and the shoulder; and a gate electrode formed on the gate oxide film. In the insulated-gate type semiconductor device, the U-shaped groove is provided with a shoulder having a radius of curvature of 0.2 to 0.7 μm.

In this case, for example, the semiconductor body comprises: a semiconductor substrate; and an epitaxial layer formed on the semiconductor substrate; the epitaxial layer comprising: one conductivity type drain region; the other conductivity type base region; and one conductivity type source region; the U-shaped groove passing through the base region from the source region and reaching the drain region.

Further, it is preferable that a crystal plane of a side wall surface of the U-shaped groove has an angle of 0 to 30 degrees with respect to a {100} plane.

Further, a manufacturing method of an insulated-gate type semiconductor device according to the present invention comprises the steps of: sequentially forming a silicon oxide film of a predetermined film thickness and a silicon nitride film of a predetermined film thickness on a semiconductor body; forming an initial groove on the semiconductor body by etching; forming an LOCOS oxide film on an inner surface of the initial groove by thermal oxidization at predetermined temperature using the nitride film as a mask, thereby forming and deforming the initial groove into a U-shaped groove; and removing the LOCOS oxide film and sequentially forming a gate oxide film and a polysilicon gate electrode on an inner surface of the U-shaped groove and a shoulder. The predetermined thickness of the silicon oxide film is in a range of 400 to 600 Å, the predetermined thickness of the silicon nitride film is in a range of 600 to 1000 Å; and the predetermined temperature is in a range of 1100 to 1200° C.

In this case, for example, the semiconductor body includes a semiconductor substrate and an epitaxial layer formed thereon, an initial layer of the epitaxial layer is determined as one conductivity type drain region, and the other conductivity type base region which is shallower than the U-shaped groove is formed on the initial layer using the LOCOS oxide film as a mask, and one conductivity type source region having high concentration is formed on the base region using the LOCOS oxide film and a photoresist film.

It is preferable that a crystal plane of the semiconductor substrate is (100) plane, a crystal plane of its orientation flat is {100} plane and a crystal plane of a side wall surface of the initial groove has an angle of 0 to 30 degrees with respect to the {100} plane.

According to the present invention, by setting the film thickness of the silicon oxide film as a buffer film of the nitride film, the film thickness of the nitride film and the formation temperature of the LOCOS oxide film in the above-described predetermined values such that the radius of curvature of the groove shoulder becomes the optimal value, it is possible to provide an MOSFET in which less electrical characteristic defect is generated. As compared with the conventional first and second typical examples, the electrical characteristic defect ratio is 1/5 or less. Further, since the crystal surface of the side wall surface of the U-shaped groove is substantially {100} plane, the moving angle becomes large, and the on-resistance can be reduced.

BRIEF DESCRIPTION OF THE DRAWINGS

FIG. 1 is a sectional view of an essential portion of a conventional MOSFET;

FIGS. 2A to 2C are sectional views of an essential portion of a manufacturing process of the MOSFET shown in FIG. 1;

DESCRIPTION OF THE PREFERRED EMBODIMENT

Figure 3:
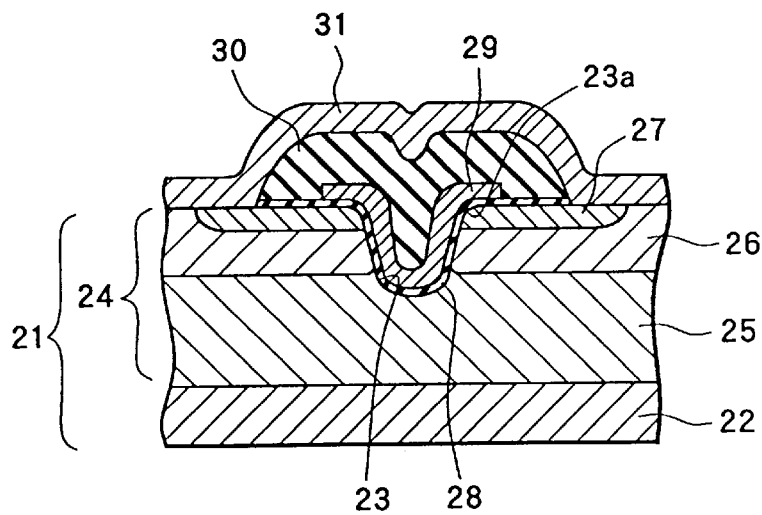
FIG. 3 is a sectional view of an essential portion of an MOSFET according to an embodiment of the present invention.
Figure 4A:
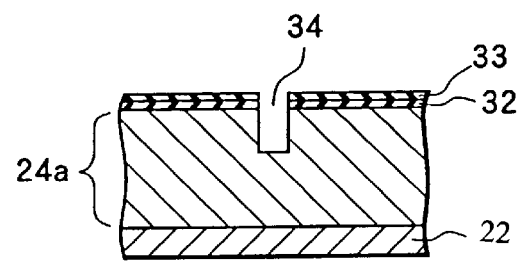
FIGS. 4A to 4C are sectional views of an essential portion of a manufacturing process of the MOSFET shown in FIG. 3.
Figure 4B:
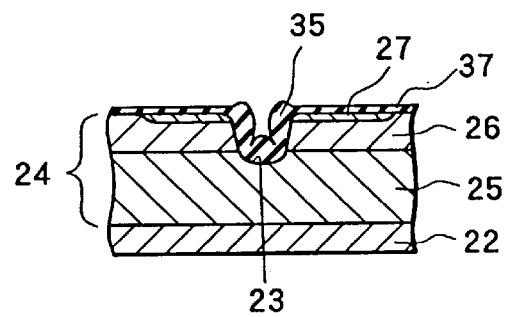
Figure 4C:
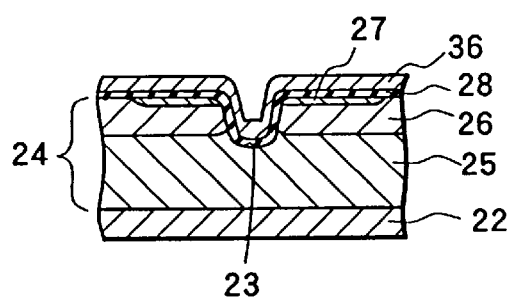

A preferred embodiment of the present invention will be explained with reference to the accompanying drawings below. FIG. 3 is a sectional view showing an MOSFET of the embodiment of the invention, FIGS. 4A to 4C are sectional views showing the manufacturing method in the order of steps.

Figure 5:
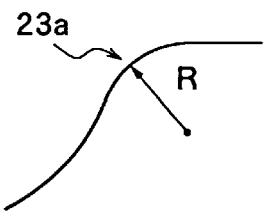
FIG. 5 is a sectional view showing a shape of a groove shoulder of the MOSFET shown in FIG. 3.

In the drawings, the reference number 21 represents a semiconductor body which includes one conductivity type n⁺ type semiconductor substrate 22 whose crystal plane on the surface of the substrate 22 is (100), and an epitaxial layer 24 provided on the semiconductor substrate 22 and formed on its surface with a plurality of U-shaped grooves (only one of them is illustrated) 23. The epitaxial layer 24 includes the n⁻ type drain region 25, p type base region 26 formed on the drain region 25, and n⁺ type source region 27 formed on the surface of the base region 26. The groove 23 is formed such that it penetrates the base region 26 from the surface of the source region 27 and reaches the drain region 25, and a crystal plane of the side wall surface of the groove 23 is formed so as to be inclined with an angle of 0 to 30 degrees with respect to a {100 } plane. As shown in FIG. 5, a groove shoulder 23a is gentle R-like shaped, and a radius of curvature thereof is 0.2 to 0.7 μm. A gate oxide film 28 is provided on an inner surface of the groove 23 and the groove shoulder 23a, and a polysilicon gate electrode 29 is provided on the gate oxide film 28. An interlayer insulation film 30 is provided on the epitaxial layer 24 such as to cover the gate electrode 29. A source electrode 31 which is electrically connected to the source region 27 and a surface of the base region 26 by Ohmic contact is provided on the interlayer insulation film 30. Although it is not illustrated, a gate wire which is electrically connected to the gate electrode 29 is provided on the source electrode 31 through an interlayer insulation film.

According to the above structure, since the groove shoulder 23a whose radius of curvature R is optimal value is formed, less dislocation is generated in the groove shoulder 23a due to lattice defect, and the generation of current leakage under the reverse tolerance voltage between the drain region 25 and the base region 26. Further, the concentration of electric field of the gate voltage to the gate oxide film 28 at the groove shoulder 23a is reduced, and the gate oxide film 28 is hard to be destroyed, and the gate short circuit is reduced. Further, during the manufacturing process, the damage of the silicon nitride film due to the thin silicon nitride film is reduced and the generation of abnormal shape of the groove 23 due to such inconvenience that oxygen passes through the silicon nitride film is also reduced. Furthermore, it is possible to avoid a situation that the radius of curvature R of the shoulder 23a is too large, the length of a channel formed in a direction of a surface of the semiconductor body becomes long, and on-resistance becomes high. Further, the crystal plane of the side wall surface of the groove 23 is inclined with the angle of 0 to 30 degrees with respect to a {100} plane and thus, the mobility is greater than that of {110} plane and the on-resistance can be reduced.

Next, a manufacturing method will be explained with reference to FIGS. 4A to 4C.

First, as shown in FIG. 4A, the initial layer of the epitaxial layer is formed on the n$^+$ type semiconductor substrate 22 in which a crystal plane of the substrate surface is (100) plane and a crystal plane of an orientation flat is {100}. Then, a silicon oxide film 32 is formed on a surface of the initial layer by thermal oxidation such that its film thickness falls in a range of 400 to 600 Å, more preferably, in a range of 450 to 550 Å. A silicon nitride film 33 is formed on the silicon oxide film 32 such that its film thickness falls in a range of 600 to 1000 Å, more preferably, in a range of 700 to 900 Å. Thereafter, the nitride film 33, the oxide film 32 and the initial layer are selectively etched by PR and dry etching, thereby forming an n$^-$ type epitaxial layer 24a in which a plurality of initial grooves 34 (only one of them is illustrated) are formed. During PR, the adjustment of alignment of patterns are carried out horizontally and vertically with respect to the orientation flat. The initial groove 34 is etched such that the crystal plane of the side wall surface thereof is inclined with an angle of 0 to 30 degrees with respect to a {100} plane, and its depth becomes 1.3μm. The depth of the initial groove may be other than 1.3 μm. The oxide film 32 is formed as a buffer film of a stress caused by the nitride film 33 when the LOCOS is oxidized during the subsequent process. As the thickness of the film is increased, the buffering effect of the stress is increased and the radius of curvature R of the groove shoulder 23a is increased. Therefore, the oxide film 32 is formed thicker than those of the conventional first and second typical examples, and the above-described thickness is employed such that the radius of curvature R becomes the optimal value. The nitride film 33 is used as a mask when the LOCOS is oxidized during the subsequent process. As the thickness of the film is reduced, the stress of the nitride film 33 itself is reduced and the radius of curvature R of the groove shoulder 23a is increased. However, inconveniences in the process may be caused such that the nitride film 33 may be damaged because of its thin thickness and oxygen passes through the nitride film 33. Therefore, the thickness of the nitride film is set within the above-described range which is smaller than that of the conventional first typical example and greater than that of the conventional second typical example such that the radius of curvature becomes the optimal value without generating the inconvenience during the processing.

Next, as shown in FIG. 4B, using the nitride film 33 as a mask, an inner surface of the initial groove 34 is thermally oxidized at oxidization temperature of 1100 to 1200° C., more preferably 1120 to 1160° C. to form an LOCOS oxide film 35 having thickness of 0.6 to 0.8 μm and with this operation, the initial groove 34 is deformed into U-shaped groove 23. The formation temperature of the LOCOS oxide film 35 is set higher than that of the conventional first typical example so that the viscosity of the oxide film 35 is increased to reduce the stress. The radius of curvature R of the groove shoulder 23a is the optimal value of 0.2 to 0.7 μm which greater than that of the conventional first typical example and smaller than that of the second typical example. The crystal surface of the side wall surface of the U-shaped groove 23 in inclined with an angle of 0 to 30 degrees with respect to the {100} plane. Thereafter, the nitride film 33 and the oxide film 32 are removed from the entire surface by the wet etching process, a silicon oxide film 37 for ion implantation is formed by the thermal oxidization and then, boron is injected by ion implantation and thermally diffused using the LOCOS oxide film 35 as a mask, thereby forming the P type base region 26 which is shallower than the U-shaped groove 23. Further, the base region 26 is masked by the LOCOS oxide film 35 and a photoresist film by PR, arsenic is injected by ion implantation, the photoresist is removed and then is thermally diffused, thereby forming the n$^+$ type source region 27. As a result, the epitaxial layer 24a shown in FIG. 2A becomes the epitaxial layer 24 including the n$^-$ type drain region 25 which is the initial layer of the epitaxial layer on which the grooves 23 are formed, the base region 26, and the source region 27.

Next, as shown in FIG. 4C, the LOCOS oxide film 35 and the oxide film 37 are removed by the wet etching process so that the base region 26, the source region 27 and the inner surface of the groove 23 are exposed. Then, the gate oxide film 28 is formed on the inner surface of the groove 23, the base region 26 and the source region 27 by the thermal oxidization process, and the surface of the epitaxial layer 24 subjected to the above-described steps is covered with the polysilicon film 36 by the CVD process.

Subsequently, as shown in FIG. 3, the gate electrode 29 is formed except a portion of the surface of the source region 27 and the polysilicon film 36 of the groove 23 by PR and dry etching processes and then, a contact film is formed on the interlayer insulation film 10 and the gate oxide film 8 such that the portion of the surface of the epitaxial layer 27 subjected to the above-described steps and the surface of the base region 26 are exposed. After that, the surface of the epitaxial layer 24 subjected to the above-described steps is covered with an aluminum film by sputtering process, and the aluminum film is selectively removed by PR and the dry etching process, thereby forming a source electrode 31 which is electrically connected to the base region 26 and the source region 27 by Ohmic contact.

According to this manufacturing method, the film thickness of the silicon oxide film 32 is in a range of 400 to 600 Å, more preferably in a range of 450 to 550 Å, the film thickness of the nitride film 33 is in a range of 600 to 1000 Å, more preferably in a range of 700 to 900 Å, and the formation temperature of the LOCOS oxide film 35 is in a range of 1100 to 1200° C., more preferably in a range of 1120 to 1160° C. With this feature, the groove shoulder 23a having the optimal radius of curvature R which is greater than that of the conventional first typical example and smaller than that of the second typical example in a state where the stress is reduced without generating such inconvenience that the nitride film 33 is damaged due to the thin thickness of the nitride film 33 and oxygen passes through the nitrogen film 33. Further, electrical characteristic defect ratio such as a current leakage under reverse tolerance voltage due to dislocation of the lattice defect, gate short circuit caused because the gate oxide film 28 is destroyed by concentration of electric field at the groove shoulder 23*a*, current leakage and short circuit due to abnormal shape of the surface of the epitaxial layer 24 due to inconvenience during process caused by the thin thickness of the nitride film 33 is the lowest, and as the film thickness of the silicon oxide film 32, the film thickness of the nitride film 33 and the formation temperature of the LOCOS oxide film 35 are deviated from the above-described ranges, the electrical characteristic defect ratio is increased. Further, since the radius of curvature R of the groove shoulder 23*a* is not unnecessary increased, it is possible to produce the MOSFET in which on-resistance due to the fact that the length of the channel formed in the direction of the surface of the epitaxial layer 24 is suppressed from being increasing. Further, the crystal plane of the side wall surface of the groove 23 has the angle of 0 to 30 degrees with respect to a {100} plane and thus, the moving angle is greater than that of the conventional {110} plane and the on-resistance can be reduced.

Although the semiconductor body comprises the semiconductor substrate and the epitaxial layer in the above-described embodiment, the semiconductor body may not comprise the epitaxial layer. In such a case, the semiconductor substrate formed with the grooves includes the drain region, the base region and the source region.

Further, although it has been described that the semiconductor substrate is of one conductivity type having high concentration, the semiconductor substrate may be of high concentration separate type. In this case, the semiconductor substrate can be utilized for conductance modulation type MOSFET.

Although it has been described that the single conductive type semiconductor substrate is of n type and the separate type semiconductor substrate is of p type, the single conductivity type semiconductor substrate may be of p type and the separate type semiconductor substrate may be of n type.

What is claimed is:

1. A manufacturing method of an insulated-gate type semiconductor device comprising the steps of:

sequentially forming a silicon oxide film of a predetermined film thickness and a silicon nitride film of a predetermined film thickness on a semiconductor body, said predetermined thickness of said silicon oxide film being in a range of 400 to 600 Å and said predetermined thickness of said silicon nitride film being in a range of 600 to 1000 Å;

forming an initial groove on said semiconductor body by etching;

forming an LOCOS oxide film on an inner surface of said initial groove by thermal oxidization at 1100 to 1200° C. using said nitride film as a mask, thereby forming and deforming said initial groove into a U-shaped groove; and removing said LOCOS oxide film and sequentially forming a gate oxide film and a polysilicon gate electrode on an inner surface of said U-shaped groove and a shoulder.

2. A manufacturing method of an insulated-gate type semiconductor device according to claim 1, wherein said semiconductor body includes a semiconductor substrate and an epitaxial layer formed thereon, an initial layer of said epitaxial layer is determined as one conductivity type drain region, and the other conductivity type base region which is shallower than said U-shaped groove is formed on said initial layer using said LOCOS oxide film as a mask, and one conductivity type source region having high concentration is formed on said base region using said LOCOS oxide film and a photoresist film.

3. A manufacturing method of an insulated-gate type semiconductor device according to claim 2, wherein a crystal plane of said semiconductor substrate is (100) plane, a crystal plane of its orientation flat is {100} plane and a crystal plane of a side wall surface of said initial groove has an angle of 0 to 30 degrees with respect to the {100} plane.

4. A manufacturing method of an insulated-gate type semiconductor device according to claim 2, wherein said semiconductor substrate is of one conductivity type having high concentration.

5. A manufacturing method of an insulated-gate type semiconductor device according to claim 2, wherein said semiconductor substrate is of the other conductivity type having high concentration.

* * * * *

UNITED STATES PATENT AND TRADEMARK OFFICE
CERTIFICATE OF CORRECTION

PATENT NO. : 6,194,273 B1
DATED : February 27, 2001
INVENTOR(S) : Matsuura, Naoki, Enjo, Hiroyasu It is certified that error appears in the above-identified patent and that said Letters Patent is hereby corrected as shown below:

Column 2,
Line 42, after "dislocation is" insert -- generated in the groove shoulder 3a due to defect of lattice --

Signed and Sealed this

Twentieth Day of November, 2001

Attest:

*Nicholas P. Godici*

NICHOLAS P. GODICI
*Acting Director of the United States Patent and Trademark Office*

*Attesting Officer*